US012572311B2

(12) United States Patent
Xie et al.

(10) Patent No.: US 12,572,311 B2
(45) Date of Patent: *Mar. 10, 2026

(54) MANAGING WRITE DISTURB BASED ON IDENTIFICATION OF FREQUENTLY-WRITTEN MEMORY UNITS

(71) Applicant: MICRON TECHNOLOGY, INC., Boise, ID (US)

(72) Inventors: Tingjun Xie, Milpitas, CA (US); Zhenming Zhou, San Jose, CA (US); Charles Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 188 days.

This patent is subject to a terminal disclaimer.

(21) Appl. No.: 18/388,342

(22) Filed: Nov. 9, 2023

(65) Prior Publication Data

US 2024/0069815 A1     Feb. 29, 2024

Related U.S. Application Data

(63) Continuation of application No. 17/468,588, filed on Sep. 7, 2021, now Pat. No. 11,853,617.

(51) Int. Cl.
 *G06F 3/06*     (2006.01)
 *G11C 16/34*    (2006.01)
(52) U.S. Cl.
 CPC ........ *G06F 3/0679* (2013.01); *G11C 16/3431* (2013.01)
(58) Field of Classification Search
 CPC .......................... G11C 16/3431; G06F 3/0679
(Continued)

(56) References Cited

U.S. PATENT DOCUMENTS 9,711,234 B1    7/2017  Van Gaasbeck
10,566,048 B2   2/2020  Qin et al.
      (Continued)

FOREIGN PATENT DOCUMENTS

KR      20160132243      11/2016

OTHER PUBLICATIONS

Boyer R.S., et al., "MJRTY—A Fast Majority Vote Algorithm," Computer Sciences Department, University of Texas at Austin and Computational Logic, Inc.: 1981, pp. 105-117.
      (Continued)

*Primary Examiner* — Connie C Yoha
(74) *Attorney, Agent, or Firm* — Lowenstein Sandler LLP

(57)     ABSTRACT

A processing device of a memory sub-system is configured to perform a plurality of write operations on a memory device comprising a plurality of memory units, the processing device is configured to maintain state information of the memory device in response to performing each write operation of a plurality of write operations on the memory device; identify, in view of the state information, a candidate memory unit of the plurality of memory units that has been written to by at least a threshold fraction of the plurality of write operations performed on the memory device; and responsive to determining that a number of write operations performed on the memory device satisfies a threshold refresh criterion and that one or more of the plurality of memory units that are proximate to the candidate memory unit satisfy a failed bit threshold criterion, refresh data stored at the one or more of the plurality of memory units that are proximate to the candidate memory unit.

20 Claims, 6 Drawing Sheets

(58) Field of Classification Search
USPC ..................................................... 365/185.25
See application file for complete search history.

(56) References Cited

U.S. PATENT DOCUMENTS

| | | | |
|---|---|---|---|
| 10,672,486 B2 | 6/2020 | Zhu et al. | |
| 11,061,608 B2 | 7/2021 | Choi et al. | |
| 11,853,617 B2 * | 12/2023 | Xie ........................ | G06F 3/0619 |
| 2016/0078918 A1 | 3/2016 | Hyun et al. | |
| 2016/0189757 A1 | 6/2016 | Damle et al. | |
| 2020/0066362 A1 * | 2/2020 | Zhu .................... | G11C 16/3495 |
| 2021/0158861 A1 | 5/2021 | Jeong et al. | |
| 2023/0402108 A1 * | 12/2023 | Xie ........................ | G11C 16/26 |

OTHER PUBLICATIONS

International Search Report and Written Opinion for International Application No. PCT/US2022/042550, mailed Dec. 8, 2022, 10 Pages.
Misra J., et al., "Finding Repeated Elements," Science of Computer Programming 2, 1982, pp. 143-152.

* cited by examiner

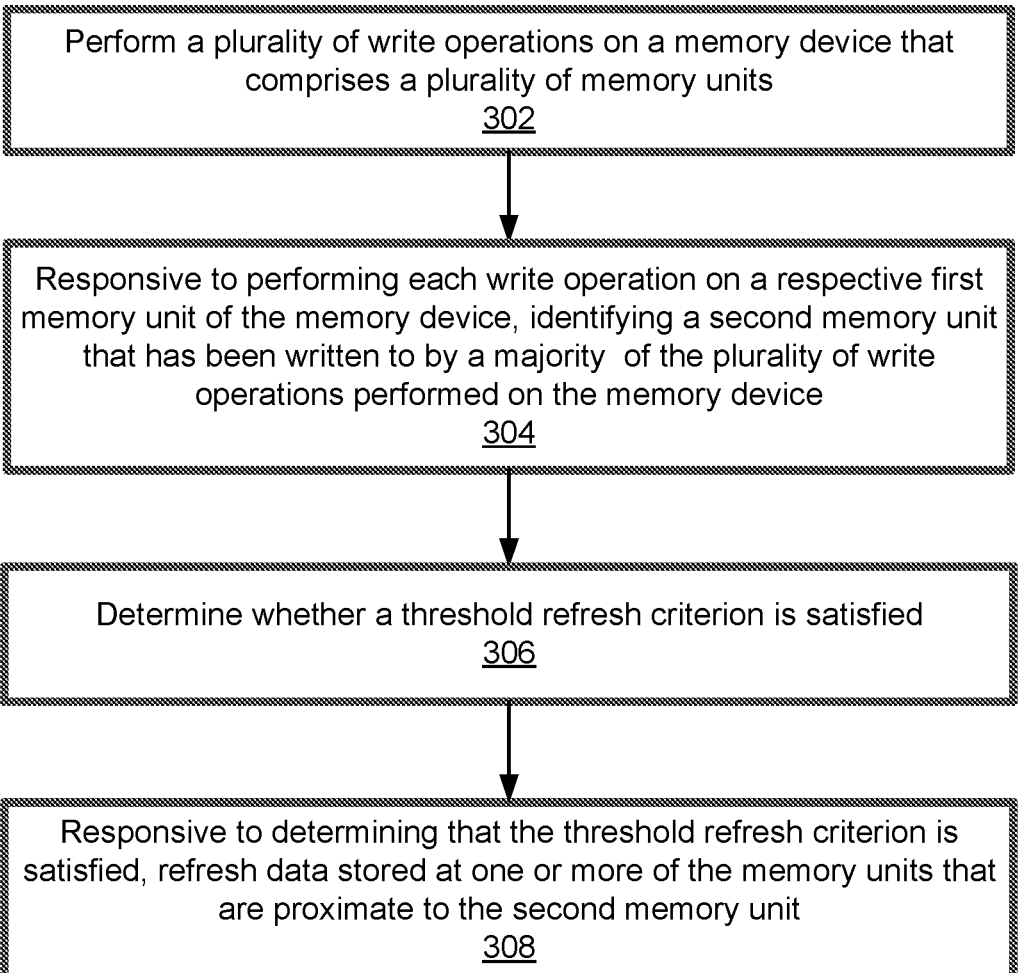

300

Perform a plurality of write operations on a memory device that
comprises a plurality of memory units
302

Responsive to performing each write operation on a respective first
memory unit of the memory device, identifying a second memory unit
that has been written to by a majority of the plurality of write
operations performed on the memory device
304

Determine whether a threshold refresh criterion is satisfied
306

Responsive to determining that the threshold refresh criterion is
satisfied, refresh data stored at one or more of the memory units that
are proximate to the second memory unit
308

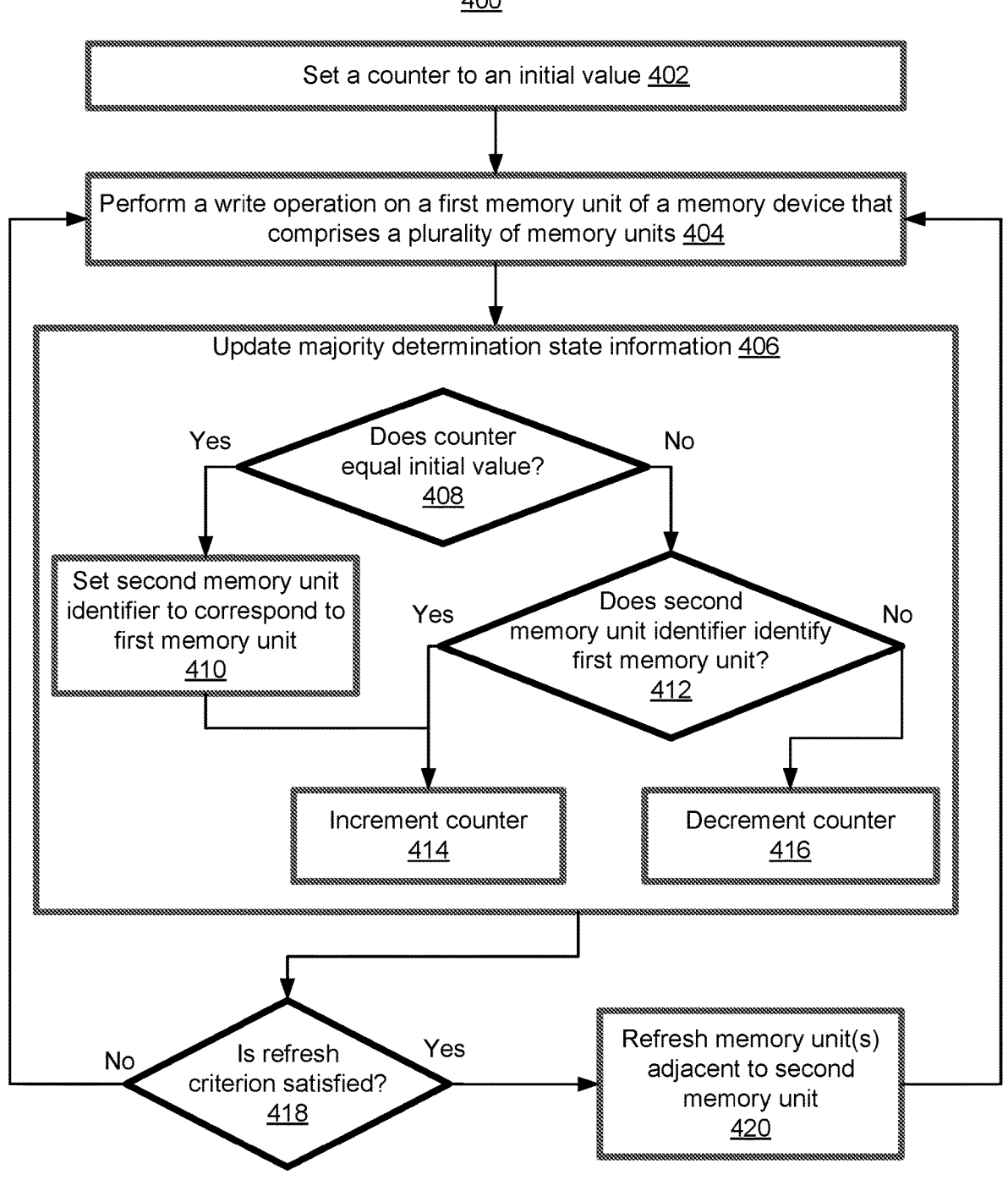

Set a counter to an initial value 402

Perform a write operation on a first memory unit of a memory device that comprises a plurality of memory units 404

Update majority determination state information 406

Does counter equal initial value? 408

Yes

No

Set second memory unit identifier to correspond to first memory unit 410

Does second memory unit identifier identify first memory unit? 412

Yes

No

Increment counter 414

Decrement counter 416

Is refresh criterion satisfied? 418

No

Yes

Refresh memory unit(s) adjacent to second memory unit 420

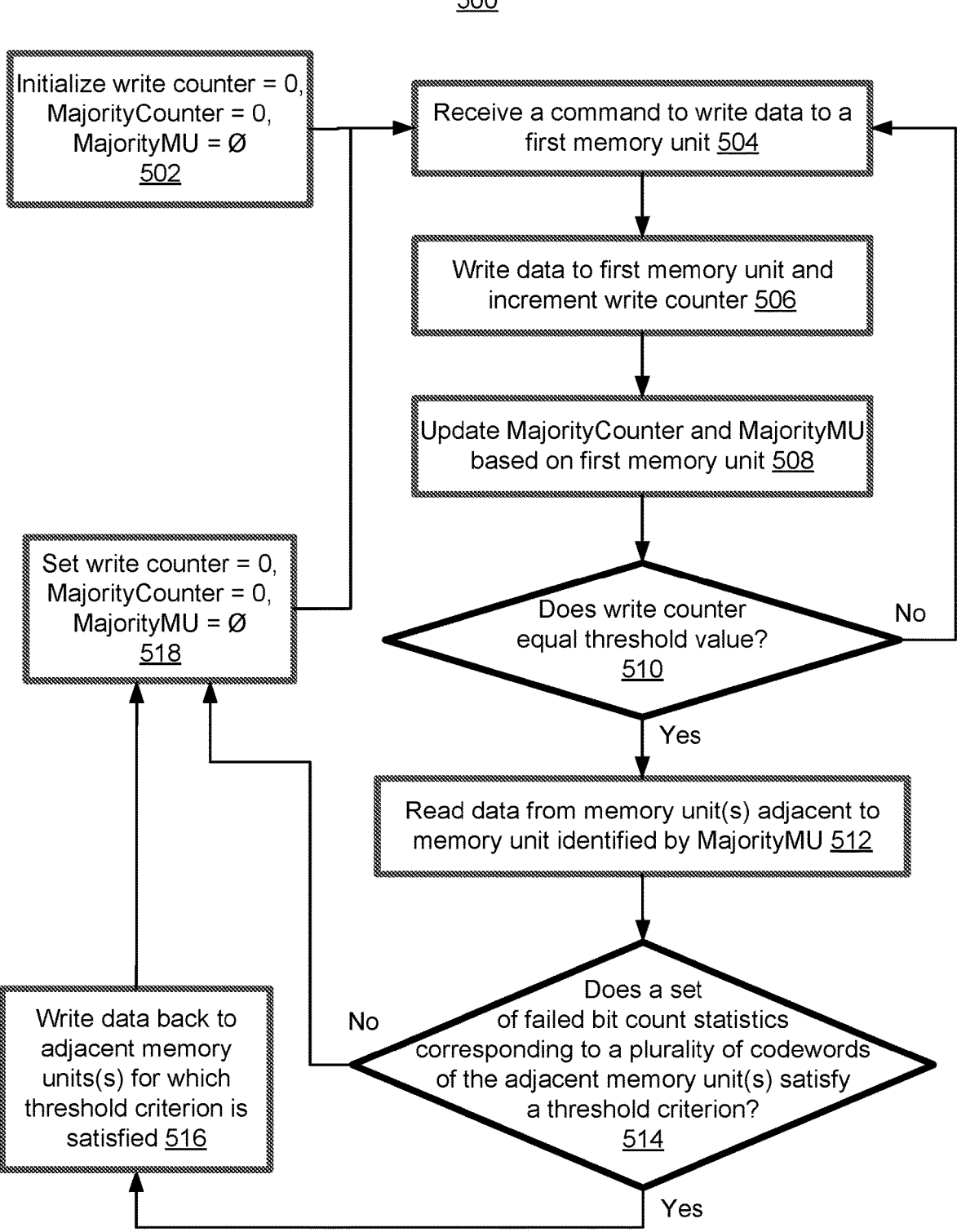

Initialize write counter = 0,
MajorityCounter = 0,
MajorityMU = Ø
502

Receive a command to write data to a
first memory unit 504

Write data to first memory unit and
increment write counter 506

Update MajorityCounter and MajorityMU
based on first memory unit 508

Does write counter
equal threshold value?
510

No

Yes

Set write counter = 0,
MajorityCounter = 0,
MajorityMU = Ø
518

Read data from memory unit(s) adjacent to
memory unit identified by MajorityMU 512

Does a set
of failed bit count statistics
corresponding to a plurality of codewords
of the adjacent memory unit(s) satisfy
a threshold criterion?
514

No

Yes

Write data back to
adjacent memory
units(s) for which
threshold criterion is
satisfied 516

PROCESSING DEVICE
602

INSTRUCTIONS
626

WRITE
DISTURB
MANAGEMENT
COMPONENT
113

STATIC MEMORY
606

BUS
630

MAIN MEMORY 604

INSTRUCTIONS
626

WRITE
DISTURB
MANAGEMENT
COMPONENT
113

NETWORK
INTERFACE
DEVICE
612

NETWORK
620

DATA STORAGE SYSTEM
618

MACHINE-READABLE
MEDIUM 624

INSTRUCTIONS
626

W2R DELAY
THRESHOLD
ADJUSTMENT
COMPONENT
113

MANAGING WRITE DISTURB BASED ON IDENTIFICATION OF FREQUENTLY-WRITTEN MEMORY UNITS

RELATED APPLICATIONS

This application is a continuation of U.S. patent application Ser. No. 17/468,588, filed Sep. 7, 2021, the entire contents of which is hereby incorporated by reference herein.

TECHNICAL FIELD

Embodiments of the disclosure relate generally to memory sub-systems, and more specifically, relate to managing write disturb based on identification of frequently-written memory units in a memory sub-system.

BACKGROUND

A memory sub-system can be a storage system, a memory module, or a hybrid of a storage device and memory module. The memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure. The drawings, however, should not be taken to limit the disclosure to the specific embodiments, but are for explanation and understanding only.

FIG. 3 is a flow diagram of an example method to refresh data of memory units that are written to by a majority of write operations in accordance with some embodiments.

FIG. 4 is a flow diagram of an example method including majority state information update operations to refresh data of memory units that are written to by a majority of write operations in accordance with some embodiments.

FIG. 5 is a flow diagram of an example method including operations to refresh data of memory units that are written to by a majority of write operations if conditional write criteria are satisfied in accordance with some embodiments.

DETAILED DESCRIPTION

Figure 1:
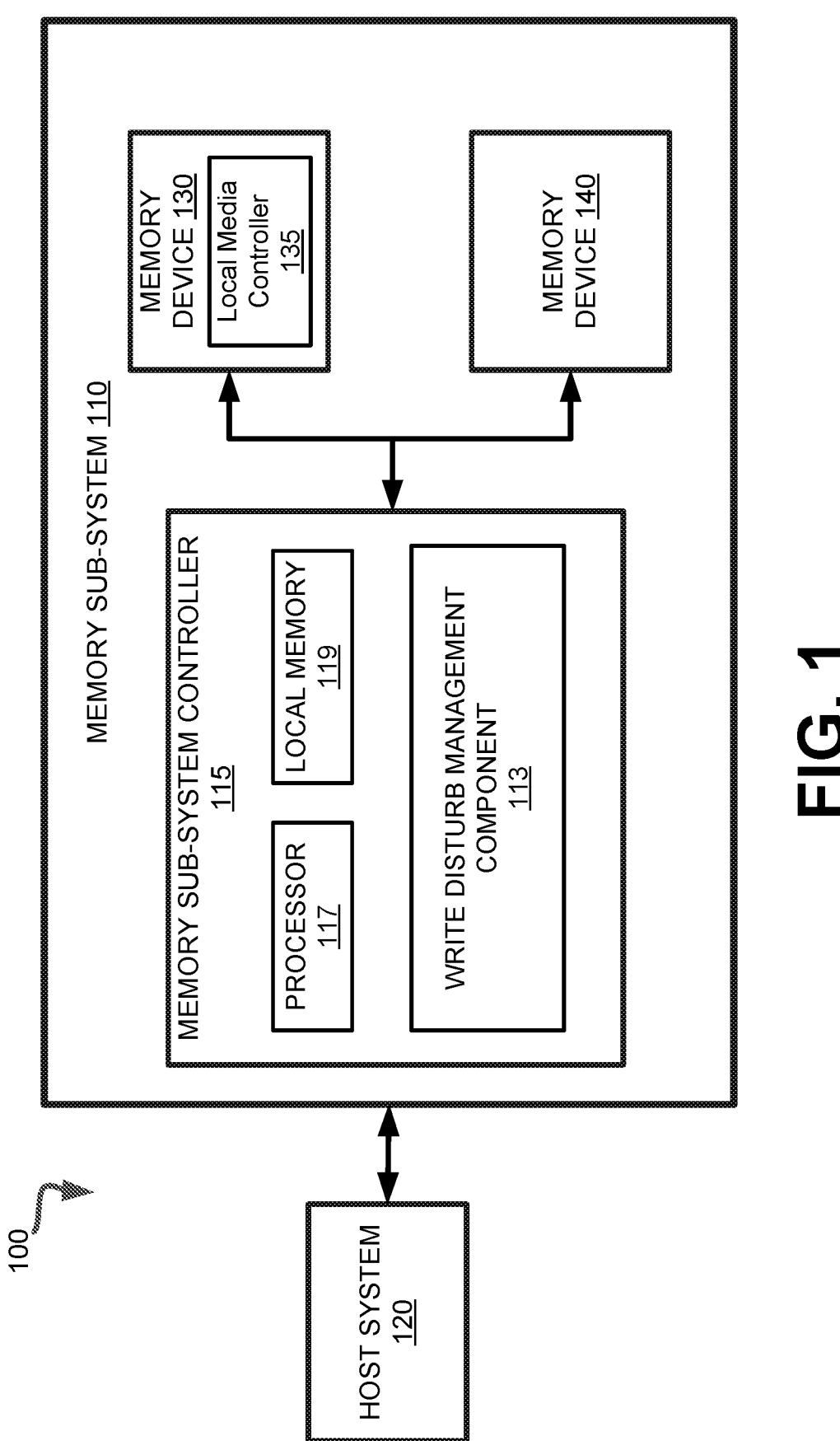
FIG. 1 illustrates an example computing system that includes a memory sub-system in accordance with some embodiments of the present disclosure.

Aspects of the present disclosure are directed to managing write disturb based on identification of frequently-written memory units in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Another example is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices and 3D cross-point devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane.

The memory device can include one or more units of memory. Each memory unit can include one or more memory cells (e.g., a page, a block, or some other translation unit (TU)). In certain memory devices, when data is written to a memory unit, adjacent (e.g., contiguous, neighboring, nearby, next to, etc.) memory units can experience what is known as "write disturb." Write disturb is the result of continually writing data to a particular memory unit without writing and/or refreshing data stored at nearby memory units, causing the nearby memory units to change state over time (e.g., the programmed state changes). If too many write operations are performed on the particular memory unit (also referred to as the "aggressor" hereinafter), data stored at adjacent or proximate memory units (also referred to as the "victim" hereinafter) of the memory device can become corrupted or incorrectly stored. The heat generated from the aggressor unit during the write operations can cause the memory alloy of the victim unit to crystalize, degrading its quality. Thus, in traditional memory sub-systems, a higher error rate can result when reading the data stored at the adjacent or proximate memory units. The higher error rate (e.g., raw bit error rate, or RBER) can increase the use of an error detection and correction operation (e.g., an error correction operation) for subsequent operations (e.g., read and/or write) performed on the memory unit. The increased use of the error correction operation can result in a reduction of the performance of the conventional memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time. Write disturb can also cause data loss, including read errors that are uncorrectable by error correction codes To mitigate the effects of write disturb on data stored at the memory sub-system, certain memory sub-systems typically utilize various write refresh processes. For example, certain memory sub-systems can perform a refresh operation based on a number of write operations performed on a memory unit. Typically, the memory sub-system stores the number of write operations performed on units of the memory device as metadata in the local memory 119 (e.g., DRAM or SRAM) of the memory sub-system, or on the memory device. For every write operation that is performed on a particular memory unit, the memory sub-system increments a write counter by one. When the counter reaches some predefined threshold number of write operations (e.g., 512 write operations), the memory sub-system can perform a refresh operation on the data of victim memory units. The refresh operation can typically include reading the data of the victim memory units, performing an error correction operation on the data, and writing back the data to the victim memory units. Once the refresh operation is performed, the memory sub-system can reset the counter to zero and then restart the process. However, the comparison of a counter to a predefined threshold number of write operations does not necessarily provide accurate indication of whether a refresh operation should be performed on the particular memory unit. Using the threshold number, a memory unit is refreshed every threshold number of writes, which occurs when the write counter reaches the predefined threshold number. However, it is possible that at the time the write counter reaches the predefined threshold number, the memory unit being written is not an aggressor. Since the aggressor is not identified, the victim memory units of the aggressor are not refreshed, and the risk of uncorrected errors occurring in the victim memory units is not mitigated.

Aspects of the present disclosure address the above and other deficiencies by providing a memory sub-system that manages write disturb based on identification of frequently-written memory units. The memory sub-system can identify frequently-written memory units and, at suitable times, perform refresh operations on memory units that are adjacent to each frequently-written memory unit. In particular implementations, the memory sub-system identifies a "majority memory unit" in response to a write operation and performs a refresh operation on each memory unit that is adjacent to the majority memory unit. "Majority memory unit" herein shall refer to a memory unit that has been written to by more than a threshold fraction of a sequence of memory operations. For example, if the threshold fraction is one-half (½), then a majority of a sequence of N write operations includes more than half of the write operations in the sequence.

The memory sub-system can identify majority memory units using a majority identification algorithm that is efficient in terms of time and memory space. The majority identification algorithm maintains state information, such as a candidate memory unit identifier that identifies a candidate majority memory unit, and a majority counter value used to determine the candidate memory unit identifier. Since the state information includes an identifier and a counter value, the size of the state information does not increase with the number of memory units or write operations. The memory sub-system efficiently updates the state information after each write operation based on the identity of the memory unit on which the write operation is performed. At intervals, such as when a threshold refresh criterion is satisfied, the memory sub-system can perform refresh operations on memory units that are adjacent to the identified majority memory unit. For example, the memory sub-system can perform the refresh operations in response to the number of writes since a previous refresh operation being greater than a threshold value.

In one implementation, the memory sub-system can perform a plurality of write operations on a memory device that includes a plurality of memory units. Each of the write operations is performed on a respective first memory unit. Responsive to performing each of the write operations on the respective first memory unit, the memory sub-system identifies a majority memory unit, determines whether a threshold refresh criterion is satisfied, and, if the threshold refresh criterion is satisfied, refreshes data stored at one or more memory units that are adjacent or proximate to the majority memory unit. The memory sub-system can identify the majority memory unit by, in response to each write operation, determining whether a value of a majority counter corresponds to an initial value (e.g., 0), setting a candidate memory unit identifier to correspond to the respective first memory unit if the value of the counter corresponds to the initial value, or adjusting the counter if the value of the counter does not correspond to the initial value. To adjust the counter, the memory sub-system increments the counter if the candidate memory unit corresponds to the respective first memory unit, or decrements the counter if the candidate memory unit does not correspond to the respective first memory unit.

Further, the memory sub-system can identify more than one frequently-written memory unit, such as the top two most-frequently-written memory units, and perform refresh operations on each of the identified frequently-written memory units. For example, the memory sub-system can set the threshold fraction used by the majority identification algorithm to one-third (⅓), in which case the majority identification algorithm identifies the top two majority memory units, each of which is written to by more than ⅓ of the write operations.

Advantages of the present disclosure include, but are not limited to, mitigating write disturb effects on units of a memory device with increased efficiency. Performing refresh operations on memory units that have been written by a majority of memory operations increases efficiency because the majority-written memory units correspond to the frequently-written memory units. Thus, the aggressor memory units are identified accurately, and the hit rate of the refresh operations is improved. Further, the frequently-written memory units are identified efficiently, because the majority identification algorithm uses relatively few operations and a relatively small amount of memory. The majority identification algorithm can be readily implemented in hardware, for example, using counters and comparison circuits.

The state information includes a numeric counter value and a majority memory unit identifier. Thus, the size of the state information does not increase with the number of memory units or the number of write operations. The majority memory unit can be identified after each write operation using a small number of operations based on the state information. Thus the majority memory unit can be identified without slowing down high-throughput memory sub-systems or using the memory resources available to the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a write disturb management component 113 that identifies frequently-written memory units of the memory sub-system 110 and performs refresh operations on the frequently-written memory units. The write disturb management component 113 can select majority memory units from a set of memory units using a majority identification algorithm as described below. Each majority memory unit corresponds to a frequently-written memory unit. The set of memory units from which the majority memory units are selected can include, for example, each memory unit of the memory sub-system 110. Each memory unit can be, for example, a page, and can include one or more memory cells of the memory device 140.

As described above, "majority memory unit" herein refers to a memory unit that has been written to by more than a threshold fraction of write operations in a sequence of write operations. The sequence of memory operations can include write operations performed since occurrence of an event such as formatting operation or other system management operation that resets a write count, for example. For example, if the threshold fraction is one-half (½), then a majority of a sequence of N write operations is more than half of the write operations. As another example, if the fraction is one-third (⅓), then there can be two majorities of a sequence of N write operations: a first majority is more than one-third of the write operations, and a second majority is more than one-third of the write operations (that do not include the first majority).

In one example, a majority memory unit that has been written to by more write operations than any of the other memory units can be identified using a threshold fraction to one-half (½), in which case the write disturb management component 113 identifies a memory unit that has been written to by more than half of the write operations in the sequence. In another example, two majority memory units, each of which has been written to by more write operations than any of the other memory units, can be identified using a threshold fraction of ⅓. In this example, the write disturb management component 113 identifies the top two majority memory units, each of which has been written to by more than ⅓ of the write operations.

In response to each write operation request received from the host system 120, or to each write operation performed by the memory sub-system 110, the write disturb management component 113 can perform write disturb management operations related to refreshing one or more frequently-written memory units. For each particular write operation, the write disturb management component 113 can update state information related to identification of the majority memory unit. The state information can include a candidate memory unit identifier and a majority counter value. The updated state information generated by the write disturb management component 113 for each write operation is available as input to the write disturb management component 113 for the next write operation.

The write disturb management component 113 can update the state information in response to each write operation by determining updated values of the candidate memory unit identifier and/or majority counter based on their current values, and further based on the particular memory unit written to by the write operation. For example, in response to each write operation, the write disturb management component 113 can determine whether the current value of the majority counter corresponds to an initial value (e.g., 0). The write disturb management component 113 can set the candidate memory unit identifier to identify the respective first memory unit if the value of the counter corresponds to the initial value, or adjust the counter if the current value of the counter does not correspond to the initial value. To adjust the counter, the write disturb management component 113 can increment the counter if the candidate memory unit corresponds to the respective first memory unit, or decrement the counter if the candidate memory unit does not correspond to the respective first memory unit. Incrementing the counter can set the current value of the counter to the previous value of the counter plus 1, and decrementing the counter can set the current value of the counter to the previous value of the counter minus 1. The write disturb management component 113 can subsequently use the updated values of the counter and/or candidate memory unit identifier as current values, e.g., in response to the next write operation.

For each particular write operation, the write disturb management component 113 can determine, based whether a threshold refresh criterion is satisfied, whether to refresh one or more memory units. The threshold refresh criterion can be satisfied if, for example, a threshold number of write operations have been performed since a previous refresh operation, and a majority memory unit exists for the sequence of write operations. The write disturb management component 113 can determine whether a threshold number of write operations have been performed by maintaining a write counter that is incremented for each write operation, and comparing the write counter to a threshold value. If the write disturb management component 113 determines that the threshold refresh criterion is satisfied, then the write disturb management component 113 refreshes data stored at one or more memory units that are adjacent or proximate to the majority memory unit. To refresh an adjacent or proximate memory unit, the write disturb management component can read data from the adjacent or proximate memory unit, correct errors in the data (if any errors are detected in the data), and write the data back to the adjacent or proximate memory unit. If there are multiple identified majority memory units (e.g., the top-2 most frequently written memory units), then the write disturb management component 113 can refresh each of the memory units that is adjacent or proximate to at least one of the identified majority memory units. Further details relating to the operations of the write disturb management component 113 are described below.

Figure 2B:
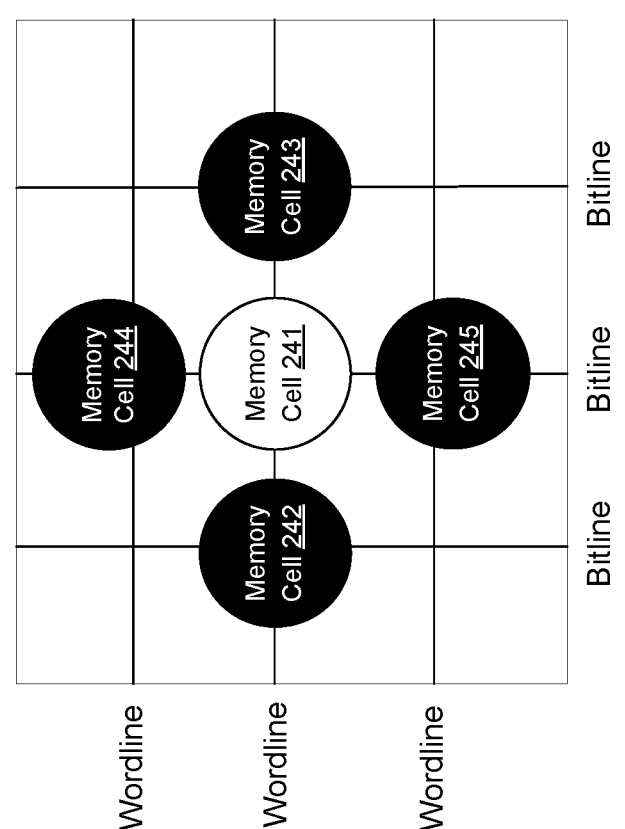
FIG. 2B illustrates an example memory unit receiving write disturb effects from adjacent memory units of a memory device in accordance with some embodiments of the disclosure.
Figure 2A:
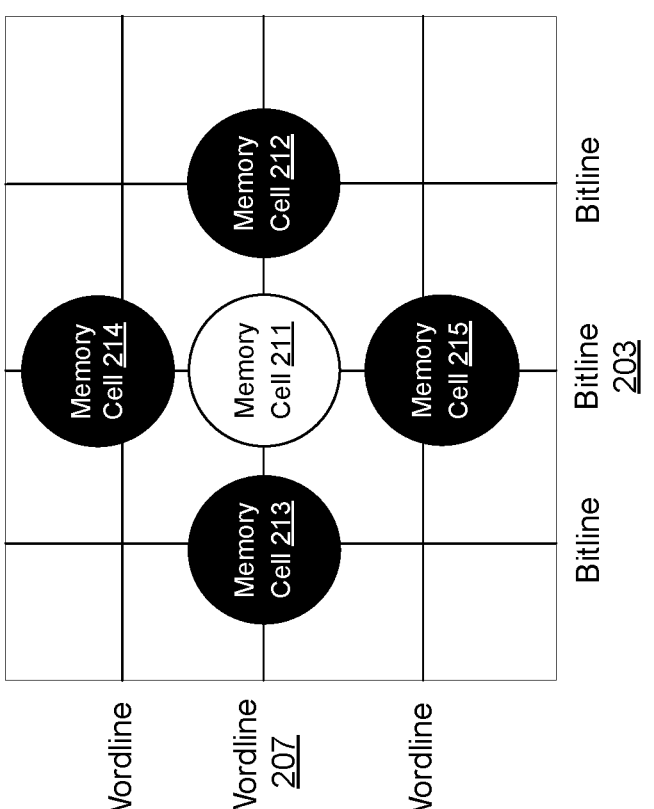
FIG. 2A illustrates an example memory unit causing a write disturb effect on adjacent memory units of a memory device in accordance with some embodiments of the disclosure.

FIG. 2A illustrates an example memory unit causing a write disturb effect on adjacent memory units of a memory device in accordance with embodiments of the disclosure. In one implementation, the memory units can be, for example, memory cells, and a memory unit 211 is adjacent to memory unit 214 and memory unit 215 vertically on a bitline 203. Memory unit 211 is also adjacent to memory unit 212 and memory unit 213 horizontally on a wordline 207. In one implementation, the memory device can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, west directions. In one implementation, the memory cell 211 can be part of one or more memory cells of a memory unit. In one implementation, the memory cells 212, 213, 214, and 215 can be part of one or more memory cells of one or more memory units.

In some implementations, when a write operation is performed to memory unit 211, the voltage state of each neighboring memory unit is altered, thus eventually resulting in a degree of distortion of data of the neighboring memory units. In this case, memory unit 211 can be referred to as an aggressor, and its neighboring memory units 212-215 are referred to as victims. In certain implementations, distortion of data of the victim memory cells 212-215 can result in data loss. In certain memory devices and/or layers of the memory device that are prone to write disturb errors on bitlines, only memory cells 215 and 214 on the bitline 203 experience write disturb errors as explained above. In certain memory devices and/or layers of the memory device that are prone to write disturb errors on wordlines, only memory cells 212 and 213 on the wordline 207 experience write disturb errors as explained above. In some implementations, certain memory devices and/or layers of the memory device are prone to write disturb errors on neither bitlines nor wordlines but are prone to write disturb errors depending on the particular layer of the memory device.

In certain implementations, victim memory units 212-215 can tolerate a certain amount of accumulated distortion before their stored data can no longer be reliably detected. Accordingly, a data refresh operation can be performed on each victim memory unit 212-215 which can include performing an error correction operation on the data stored at each memory unit 212-215 and then writing the data back to the same memory units 212-215, thus mitigating the effect of the write disturb caused by the aggressor memory unit 211, FIG. 2B illustrates an example memory unit receiving write disturb effects from adjacent memory units of a memory device in accordance with embodiments of the disclosure. In one implementation, a memory unit 241 is adjacent to memory unit 244 and memory unit 245 vertically. Memory unit 241 is also adjacent to memory unit 242 and memory unit 243 horizontally. In one implementation, the memory device can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, west directions.

In some implementations, when a write operation is performed to memory unit 242, a write disturb effect can be received at memory unit 241, as a result of the write operation at memory unit 242. In this case, the write disturb effect is received at memory unit 241 from a horizontal direction. Similarly, when a write operation is performed to memory unit 243, a write disturb effect from a horizontal direction can be received at memory unit 241, as a result of the write operation at memory unit 243. When a write operation is performed to memory unit 244, a write disturb effect can be received at memory unit 241, as a result of the write operation at memory unit 244. In this case, the write disturb effect is received at memory unit 241 from a vertical direction.

FIG. 3 is a flow diagram of an example method 300 to refresh data of memory units that are written to by a majority of write operations in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 302, the processing logic performs a plurality of write operations on a memory device that comprises a plurality of memory units. At operation 304, the processing logic, responsive to performing each write operation on a respective first memory unit of the memory device, identifies a candidate memory unit that has been written to by a majority of the plurality of write operations performed on the memory device. The processing logic can identify the candidate memory unit by determining whether a value of a majority counter corresponds to an initial value (e.g., 0), setting a candidate memory unit identifier to correspond to the respective first memory unit if the value of the counter corresponds to the initial value, or adjusting the counter if the value of the counter does not correspond to the initial value. To adjust the counter, the memory sub-system increments the counter if the candidate memory unit corresponds to the respective first memory unit, or decrements the counter if the candidate memory unit does not correspond to the respective first memory unit.

If a majority memory unit exists, then the majority memory unit is identified by the candidate memory unit identifier set by the operations described above. However, if a majority memory unit does not exist, then the candidate memory unit identifier identifies an arbitrarily-chosen one of the memory units written to by one of the plurality of write operations.

At operation 306, the processing logic determines whether a threshold refresh criterion is satisfied. The threshold refresh criterion can be satisfied if, for example, a threshold number of write operations have been performed since a previous refresh operation, and a majority memory unit exists for the sequence of write operations. The processing logic can determine whether a threshold number of write operations have been performed by maintaining a write counter that is incremented for each write operation, and comparing the write counter to a threshold value.

At operation 308, the processing logic, responsive to determining that the threshold refresh criterion is satisfied, refreshes data stored at one or more of the memory units that are proximate to the candidate memory unit that was identified at operation 304. To refresh the data, the processing logic can read data from and write the data back one or more of the memory units that are adjacent to the candidate memory unit. For example, the candidate memory unit can be the aggressor 211 shown in FIG. 2A, and the adjacent memory units can include one or more of the east victim 212, the west victim 213, the north victim 214, and the south victim 215.

FIG. 4 is a flow diagram of an example method 400 including majority state information update operations to refresh data of memory units that are written to by a majority of write operations in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing logic sets a counter to an initial value (e.g., 0, or other numeric value). At operation 404, the processing logic performs a write operation on a first memory unit of a memory device, such as memory device 130, that includes a plurality of memory units. At operation 406, the processing logic updates majority determination state information for the memory device. To update the majority determination state information the processing block performs operations 408-416.

At operation 408, the processing logic determines whether the counter equals the initial value. If the counter equals the initial value, then at operation 410 the processing logic sets a candidate memory unit identifier to correspond to the first memory unit. For example, the processing logic can set the value of the candidate memory unit identifier to be the value of an identifier of the first memory unit. Subsequent to operation 410, the processing logic performs operation 414, as described below. If operation 408 determines that the counter does not equal the initial value, then at operation 412 the processing logic determines whether the candidate memory unit identifier identifies the first memory unit. If so, at block 414 the processing logic increments the counter. If not, at block 416, the processing logic decrements the counter. Subsequent to each of operations 414 and 416, the processing logic performs operation 418, as described below.

At operation 418, the processing logic determines whether a refresh criterion is satisfied. For example, the refresh criterion can be satisfied when a number of write operations performed on the memory device is greater than a threshold value. If the refresh criterion is satisfied, then the processing logic performs operation 420. If the refresh criterion is not satisfied, then the processing logic again performs operation 404 and subsequent operations.

At operation 420, the processing logic refreshes one or more memory units adjacent to candidate memory unit. For example, the processing logic can read data from and write the data back to each memory unit that is adjacent to the candidate memory unit. The processing logic can correct errors in the data (e.g., using error correction information) prior to writing it back to the adjacent memory unit. For example, the candidate memory unit can be the aggressor 211 shown in FIG. 2A, and the adjacent memory units can include one or more of the east victim 212, the west victim 213, the north victim 214, and the south victim 215.

FIG. 5 is a flow diagram of an example method 500 including operations to refresh data of memory units that are written to by a majority of write operations if conditional write criteria are satisfied in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 502, the processing logic initializes a write counter to 0 and initializes state information related to identifying a majority memory unit. The write counter counts the number of write operations performed by a memory device 130, e.g., since a previous refresh operation. The state information includes a majority counter, which the processing logic initializes to 0, and a majority memory unit identifier ("MajorityMU"), which is a set that can contain the identity of a majority memory unit. The processing logic initializes MajorityMU to Ø (the empty set) to indicate that the majority memory unit is unidentified. Alternatively, the majority memory unit identifier MajorityMU can be repre-
sented as a numeric value, and can be set to a designated
value (e.g., −1) to indicate that the majority memory unit is
unidentified, or to an identifier of a memory unit to indicate
that MajorityMU identifies the majority memory unit.

At operation 504, the processing logic receive a command
to write data to a first memory unit. The processing logic can
receive the command from a host system 120, for example.
At operation 506, the processing logic writes the data to the
first memory unit and increments the write counter, e.g., by
increasing the value of the write counter by 1. At operation
508, the processing logic updates the values of Majority-
Counter and MajorityMU based on the first memory unit,
e.g., as described above with respect to operation 406 of
FIG. 4. For example, at operation 508, the processing logic
can determine whether MajorityCounter is equal to 0. If so,
the processing logic can set MajorityMU to include a
memory unit identifier that identifies the first memory unit
and increment MajorityCounter. If MajorityCounter is not
equal to 0, the processing logic can determine whether
MajorityMU is equal to (e.g., contains or has the same value
as) a memory unit identifier of the first memory unit. If so,
the processing logic can increment Majority Counter. If not,
the processing logic can decrement MajorityCounter. At this
point, MajorityMU identifies a candidate memory unit,
which can be either an actual majority memory unit (if one
exists) or a memory unit that is not a majority memory unit.
If the candidate memory unit is not a majority memory unit
(e.g., is a false positive), the candidate memory unit can still
be refreshed by method 500, since the refresh operation does
not change the values of the data stored in the memory unit.

At operation 510, the processing logic determines
whether the write counter equals a threshold value. The
threshold value can be, e.g., a minimum number of write
operations to be performed between refresh operations. If
the write counter is not equal to the threshold value (e.g., is
less than the threshold value), then the processor again
performs operation 504 and subsequent operations. If the
write counter is equal to the threshold value, then the
processing logic performs operation 512.

At operation 512, the processing logic reads data from one
or more memory units that are adjacent to the memory unit
identified by MajorityMU. For example, with reference to
FIG. 2A, if the memory unit identified by MajorityMU is
memory cell 211, then the adjacent memory units can
include one or more of memory cells 212, 213, 214, or 215.
At operation 514, the processing logic determines, for each
of the adjacent memory units, whether a set of failed bit
count statistics corresponding to a plurality of codewords of
the adjacent memory unit satisfies a directional failed bit
count (FBC) threshold criterion. The directional FBC
threshold criterion can be, for example, that one or more of
the failed bit count statistics is greater than a threshold
number. The set of failed bit count statistics can be associ-
ated with a set of codewords of the adjacent memory unit.
The set of codewords can include data from the adjacent
memory unit. The directional FBC threshold criterion can be
based on offline media characteristics of the memory device.
The directional FBC threshold criterion can vary depending
on the characteristics of the memory device. In some
embodiments, determining whether the set of failed bit
count statistics satisfies the directional FBC threshold cri-
terion includes determining a failed bit count for each
codeword of the set of codewords of the adjacent memory
unit. In one embodiment, the failed bit count can indicate a
directional number of bit flips associated with each code-
word from one specific logic state to another logic state. In one embodiment, the directional number of bit flips can
include the number of bits that have flipped from a logic
state of 0 to a logic state of 1. In one embodiment, the
directional number of bit flips can include the number of bits
that have flipped from a logic state of 1 to a logic state of 0.
The processing logic can identify a codeword of the set of
codewords with a maximum number of failed bit counts. For
example, the processing logic can compare the failed bit
count of each codeword to identify the failed bit count with
the highest value. The processing logic can determine that
the codeword with the maximum number of failed bit counts
satisfies the directional FBC threshold criterion (e.g., is
greater than the threshold number).

In some embodiments, determining whether the set of
failed bit count statistics satisfies the directional FBC thresh-
old criterion can include determining a failed bit count for
each codeword of the set of the codewords of the memory
unit. In one embodiment, the failed bit count can indicate a
directional number of bit flips associated with each code-
word from one specific logic state to another logic state. In
one embodiment, the directional number of bit flips can
include the number of bits that have flipped from a logic
state of 0 to a logic state of 1. In one embodiment, the
directional number of bit flips can include the number of bits
that have flipped from a logic state of 1 to a logic state of 0.
The processing logic can calculate an average number of
failed bit counts among the set of codewords. In some
embodiments, the processing logic can determine a total
number of failed bit counts of the set of codewords. The
processing logic can determine the total number of failed bit
counts of the set of codewords by additively computing a
value associated with the failed bit count for each codeword.
The processing logic can calculate the average number of
failed bit counts based on the total number of failed bit
counts and a number of codewords associated with the failed
bit count. The processing logic can determine that the
average number of failed bit counts satisfies the directional
FBC threshold criterion.

In some embodiments, determining whether the set of
failed bit count statistics satisfies the directional FBC thresh-
old criterion can include determining a failed bit count for a
codeword of the set of codewords of the adjacent memory
unit. In one embodiment, the failed bit count can indicate a
directional number of bit flips associated with each code-
word from one specific logic state to another logic state. In
one embodiment, the directional number of bit flips can
include the number of bits that have flipped from a logic
state of 0 to a logic state of 1. In one embodiment, the
directional number of bit flips can include the number of bits
that have flipped from a logic state of 1 to a logic state of 0.
The processing logic can identify each codeword of the set
of codewords associated with the failed bit count that is
greater than a threshold number of failed bit counts. The
processing logic can determine that the identified codeword
satisfies the directional FBC threshold criterion.

In some embodiments, the set of failed bit count statistics
can include one or more of the following as described above:
the codeword with the maximum number of failed bit
counts, the set of codewords having an average number of
failed bit counts greater than the directional FBC threshold
criterion, and/or the codeword associated with a failed bit
count greater than the threshold number of failed bit counts.

If the set of failed bit count statistics corresponding to the
plurality of codewords of the adjacent memory unit(s)
satisfies the directional FBC threshold criterion, then the
processing logic performs operation 516. At operation 516,
the processing logic performs a refresh operation that writes the data back to the adjacent memory unit(s) for which the directional FBC threshold criterion is satisfied. The refresh operation can include performing an error correction operation on data stored on one or more memory cells of the adjacent memory units to which the refresh operation writes the data. At operation 518, the processing logic sets the write counter and MajorityCounter to 0, and sets MajorityMU to Ø (the empty set). In other implementations, at operation 518, the processing logic can set MajorityMU to value such as −1, which does not collide with (e.g., have the same value as) any memory unit identifiers. If at operation 514 the processing logic determines that the set of failed bit count statistics corresponding to the plurality of codewords of the adjacent memory unit(s) does not satisfy the directional FBC threshold criterion, the processing logic performs 518 without performing operation 516. After performing operation 518, the processing logic again performs operation 504 and subsequent operations to receive and process another write command.

The techniques described herein for identifying a majority memory unit can be extended to identifying two or more majority memory units. For example, if the threshold fraction is ⅓, then two majority memory units (each written to by more than ⅓ of the write operations) can be identified, and at operation 512, the processing logic can read data from each memory unit that is adjacent to at least one of the majority memory units. To identify two majority memory units, a second majority counter, named MajorityCounter2, and a second majority memory unit identifier, named MajorityMU2, can be introduced. The processing logic can set MajorityCounter2 to 0 and set MajorityMU2 to Ø (the empty set) at operations 502 and 518. The variables MajorityCounter and MajorityMU can be referred to as MajorityCounter1 and MajorityMU1.

At operation 508, to identify two majority memory units, the processing logic can update the values of MajorityCounter1, MajorityCounter2, MajorityMU1, and MajorityMU2 based on the first memory unit. At operation 508, the processing logic determines whether MajorityCounter1 is equal to 0 and the memory unit identifier of the first memory unit is unequal to MajorityMU2. If so, the processing logic can set MajorityMU1 to a memory unit identifier of the first memory unit and increment MajorityCounter1. If MajorityCounter1 is not equal to 0 or the memory unit identifier of the first memory unit is equal to MajorityMU2, the processing logic can determine whether MajorityCounter2 is equal to 0 and the memory unit identifier of the first memory unit is unequal to MajorityMU1. If so, the processing logic can set MajorityMU2 to the memory unit identifier of the first memory unit and increment MajorityCounter2. Otherwise, if neither of the above conditions are satisfied, the processing logic can determine whether MajorityMU1 is equal to the memory unit identifier of the first memory unit. If so, the processing logic can increment MajorityCounter1. Otherwise, the processing logic can determine whether MajorityMU2 is equal to the memory unit identifier of the first memory unit. If so, the processing logic can increment MajorityCounter2.

Otherwise, if none of the above conditions are satisfied, the processing logic can decrement both MajorityCounter1 and MajorityCounter2. At this point, MajorityMU1 and MajorityMU2 identify candidate memory units, either or both of which can be either an actual majority memory unit or a memory unit that is not a majority memory unit. If one or both of the candidate memory units is not a majority memory unit (e.g., is a false positive), the candidate memory unit(s) can still be refreshed by method 500. The refresh operation does not change the values of the data stored in the memory unit.

Figure 6:
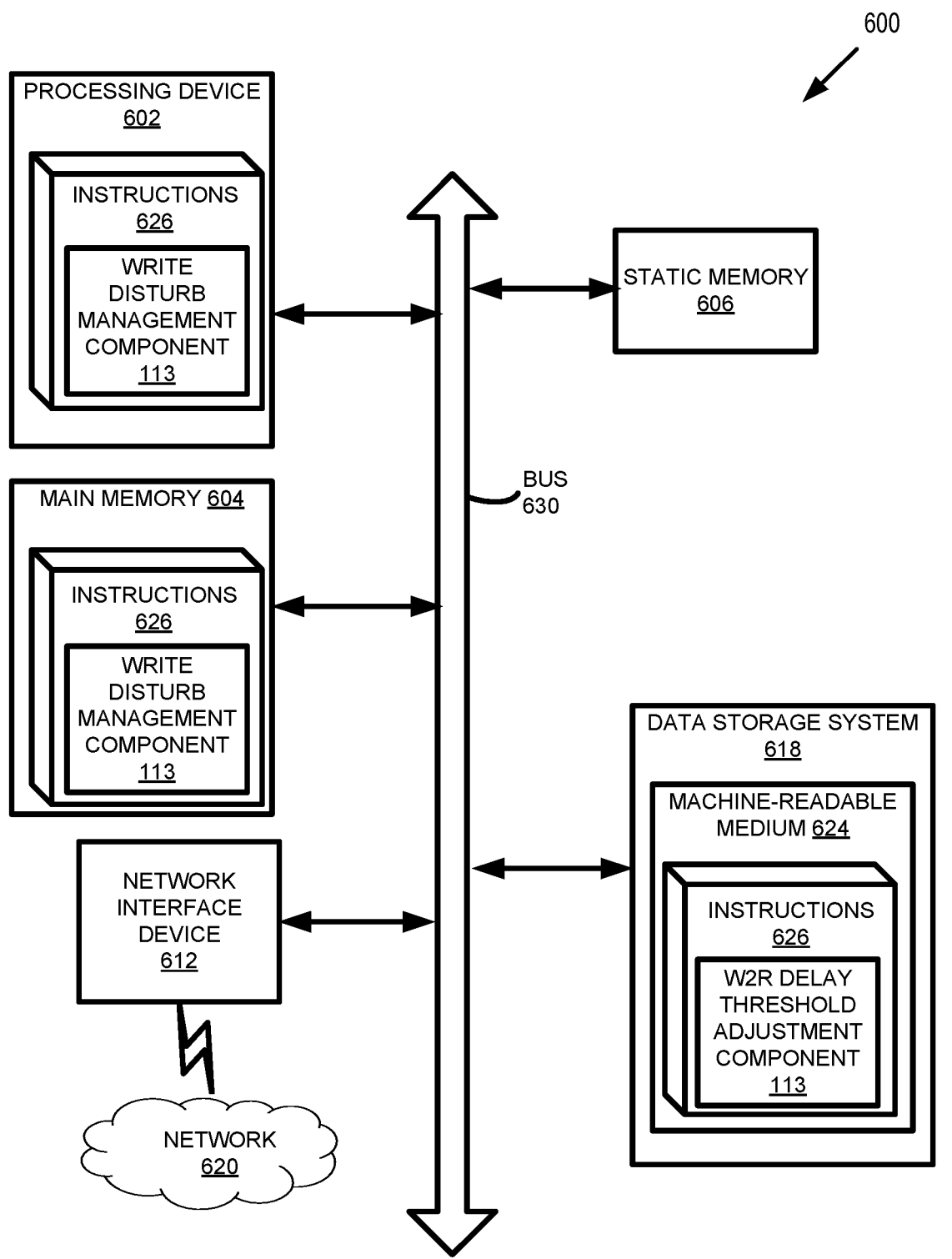
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a write disturb management component of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device comprising a plurality of memory units; and a processing device, operatively coupled to the memory device, to perform operations comprising:

maintaining state information of the memory device in response to performing each write operation of a plurality of write operations on the memory device;

identifying, in view of the state information, a candidate memory unit of the plurality of memory units that has been written to by at least a threshold fraction of the plurality of write operations performed on the memory device; and responsive to determining that a number of write operations performed on the memory device satisfies a threshold refresh criterion and that one or more of the plurality of memory units that are proximate to the candidate memory unit satisfy a failed bit threshold criterion, refreshing data stored at the one or more of the plurality of memory units that are proximate to the candidate memory unit.

2. The system of claim 1, wherein the state information comprises a candidate memory unit identifier and a value of a counter.

3. The system of claim 1, wherein the operations further comprise:

setting a value of a counter to an initial value prior to performing the plurality of write operations on the memory device.

4. The system of claim 1, wherein the candidate memory unit is identified by a candidate memory unit identifier, and identifying the candidate memory unit comprises:

determining whether a value of a counter corresponds to an initial value; and responsive to determining that the value of the counter corresponds to the initial value, setting the candidate memory unit identifier to correspond to a respective first memory unit of the memory device.

5. The system of claim 4, wherein identifying the candidate memory unit further comprises:

responsive to determining that the value of the counter does not correspond to the initial value, determining whether the candidate memory unit identifier corresponds to the respective first memory unit;

responsive to determining that the candidate memory unit identifier corresponds to the respective first memory unit, incrementing the value of the counter; and responsive to determining that the candidate memory unit identifier does not correspond to the respective first memory unit, decrementing the value of the counter.

6. The system of claim 1, wherein the operations further comprise:

responsive to performing each memory operation, incrementing a write count that indicates the number of write operations performed on the memory device.

7. The system of claim 1, wherein determining that one or more of the memory units that are proximate to the candidate memory unit satisfy the failed bit threshold criterion comprises:

reading data from the one or more of the memory units that are proximate to the candidate memory unit; and determining whether the data read from the one or more of the memory units satisfies the failed bit threshold criterion.

8. The system of claim 1, wherein the operations further comprise:

resetting a value of a counter to an initial value in response to determining that the number of write operations performed on the memory device satisfies the threshold refresh criterion.

9. A method comprising:

maintaining, by a processing device, state information of a memory device in response to performing each write operation of a plurality of write operations on the memory device, the memory device comprising a plurality of memory units;

identifying, in view of the state information, a candidate memory unit of the plurality of memory units that has been written to by at least a threshold fraction of the plurality of write operations performed on the memory device; and responsive to determining that a number of write operations performed on the memory device satisfies a threshold refresh criterion and that one or more of the plurality of memory units that are proximate to the candidate memory unit satisfy a failed bit threshold criterion, refreshing data stored at the one or more of the plurality of memory units that are proximate to the candidate memory unit.

10. The method of claim 9, wherein the state information comprises a candidate memory unit identifier and a value of a counter.

11. The method of claim 9, further comprising:

setting a value of a counter to an initial value prior to performing the plurality of write operations on the memory device.

12. The method of claim 9, wherein the candidate memory unit is identified by a candidate memory unit identifier, and identifying the candidate memory unit comprises:

determining whether a value of a counter corresponds to an initial value; and responsive to determining that the value of the counter corresponds to the initial value, setting the candidate memory unit identifier to correspond to a respective first memory unit of the memory device.

13. The method of claim 12, wherein identifying the candidate memory unit further comprises:

responsive to determining that the value of the counter does not correspond to the initial value, determining whether the candidate memory unit identifier corresponds to the respective first memory unit;

responsive to determining that the candidate memory unit identifier corresponds to the respective first memory unit, incrementing the value of the counter; and responsive to determining that the candidate memory unit identifier does not correspond to the respective first memory unit, decrementing the value of the counter.

14. The method of claim 9, further comprising:

responsive to performing each memory operation, incrementing a write count that indicates the number of write operations performed on the memory device.

15. The method of claim 9, wherein determining that one or more of the memory units that are proximate to the candidate memory unit satisfy the failed bit threshold criterion comprises:

reading data from the one or more of the memory units that are proximate to the candidate memory unit; and determining whether the data read from the one or more of the memory units satisfies the failed bit threshold criterion.

16. The method of claim 9, further comprising:

resetting a value of a counter to an initial value in response to determining that the number of write operations performed on the memory device satisfies the threshold refresh criterion.

17. A non-transitory machine-readable storage medium storing instructions that cause a processing device to perform operations comprising:

maintaining state information of a memory device in response to performing each write operation of a plurality of write operations on the memory device, the memory device comprising a plurality of memory units;

identifying, in view of the state information, a candidate memory unit of the plurality of memory units that has been written to by at least a threshold fraction of the plurality of write operations performed on the memory device; and responsive to determining that a number of write operations performed on the memory device satisfies a threshold refresh criterion and that one or more of the plurality of memory units that are proximate to the candidate memory unit satisfy a failed bit threshold criterion, refreshing data stored at the one or more of the plurality of memory units that are proximate to the candidate memory unit.

18. The non-transitory machine-readable storage medium of claim 17, wherein the state information comprises a candidate memory unit identifier and a value of a counter.

19. The non-transitory machine-readable storage medium of claim 17, wherein determining that one or more of the memory units that are proximate to the candidate memory unit satisfy the failed bit threshold criterion comprises:

reading data from the one or more of the memory units that are proximate to the candidate memory unit; and determining whether the data read from the one or more of the memory units satisfies the failed bit threshold criterion.

20. The non-transitory machine-readable storage medium of claim 17, wherein the operations further comprise:

resetting a value of a counter to an initial value in response to determining that the number of write operations performed on the memory device satisfies the threshold refresh criterion.

* * * * *